United States Patent
Seki et al.

(10) Patent No.: US 9,905,736 B2
(45) Date of Patent: Feb. 27, 2018

(54) WHITE LIGHT-EMITTING DEVICE WITH SEALING RESIN INCLUDING A PLURALITY OF PHOSPHORS

(71) Applicant: TOYODA GOSEI CO., LTD., Kiyosu-shi (JP)

(72) Inventors: Satomi Seki, Kiyosu (JP); Yuta Morimura, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/433,762

(22) Filed: Feb. 15, 2017

(65) Prior Publication Data

US 2017/0250324 A1 Aug. 31, 2017

(30) Foreign Application Priority Data

Feb. 29, 2016 (JP) ................................. 2016-037644

(51) Int. Cl.
*H01L 33/00* (2010.01)
*H01L 33/50* (2010.01)
*H01L 33/56* (2010.01)

(52) U.S. Cl.
CPC .......... *H01L 33/507* (2013.01); *H01L 33/504* (2013.01); *H01L 33/56* (2013.01)

(58) Field of Classification Search
CPC ...... H01L 33/507; H01L 33/504; H01L 33/05
See application file for complete search history.

(56) References Cited

U.S. PATENT DOCUMENTS

| | | | |
|---|---|---|---|
| 8,890,403 B2 | 11/2014 | Sakuta et al. | |
| 2012/0049237 A1* | 3/2012 | Hata | H01L 25/167 257/99 |
| 2013/0264937 A1 | 10/2013 | Sakuta et al. | |
| 2015/0153010 A1* | 6/2015 | Okuyama | F21K 9/56 362/510 |
| 2015/0270449 A1* | 9/2015 | Park | H01L 33/504 257/98 |
| 2015/0380611 A1* | 12/2015 | Lee | G02B 6/0068 362/609 |

(Continued)

FOREIGN PATENT DOCUMENTS

WO WO 2012/050199 A1 4/2012
WO WO 2015/068513 A1 5/2015

*Primary Examiner* — Ismail Muse
(74) *Attorney, Agent, or Firm* — McGinn IP Law Group, PLLC

(57) ABSTRACT

A white light-emitting device includes a light-emitting element that emits a blue light, and a sealing resin that seals the light-emitting element and that includes a first phosphor and a second phosphor, the first phosphor wavelength-converting a portion of the blue light and emitting a red light, the second phosphor wavelength-converting a portion of the blue light and emitting a green light. The white light-emitting device emits a white light by mixing the blue, red and green lights. The sealing resin further includes a third phosphor that wavelength-converts a portion of the blue light, emits a light in a same color gamut as the first or second phosphor, and has a higher light conversion efficiency than the first or second phosphor. The third phosphor is included in the sealing resin at an additive amount less than an amount that causes a change in a spectrum of the white light.

16 Claims, 3 Drawing Sheets

(56) References Cited

U.S. PATENT DOCUMENTS

| | | | |
|---|---|---|---|
| 2015/0380614 A1* | 12/2015 | Hiramatsu | C09K 11/617 |
| | | | 257/98 |
| 2016/0049560 A1* | 2/2016 | Oh | H01L 33/504 |
| | | | 257/98 |
| 2016/0150200 A1* | 5/2016 | Saka | G03B 21/005 |
| | | | 353/31 |
| 2016/0276549 A1* | 9/2016 | Yamashita | H05B 37/02 |
| 2017/0005239 A1* | 1/2017 | Asai | H01L 33/504 |
| 2017/0179347 A1* | 6/2017 | Asai | H01L 33/504 |
| 2017/0345976 A1* | 11/2017 | Asai | H01L 33/504 |

* cited by examiner

WHITE LIGHT-EMITTING DEVICE WITH SEALING RESIN INCLUDING A PLURALITY OF PHOSPHORS

The present application is based on Japanese patent application No. 2016-037644 filed on Feb. 29, 2016, the entire contents of which are incorporated herein by reference.

BACKGROUND OF THE INVENTION

1. Field of the Invention

The invention relates to a white light-emitting device configured by using a combination of a blue light-emitting element and phosphors.

2. Description of the Related Art

A white light-emitting device is known in which a light-emitting element such as blue LED chip is sealed with a sealing resin containing a yellow phosphor such as YAG phosphor ($Y_3Al_5O_{12}$:Ce).

On the other hand, a white light-emitting device using red and green phosphors in combination with a blue light-emitting element has become popular on the ground that a color gamut thereof is wider than that of the white light-emitting device using the yellow phosphor such as YAG phosphor. Particularly, a combination of a KSF phosphor ($K_2SiF_6$:Mn) as a red phosphor with a β-SiAlON phosphor (($Si,Al)_6(O,N)_8$:Eu) as a green phosphor has drawn attention since both have narrow emission spectra.

In the white light-emitting device using the KSF phosphor and β-SiAlON phosphor, color purity can be improved due to the narrow emission spectra. Phosphors having narrow emission spectra, however, have such properties that afterglow time is long and response speed is slow.

In addition, since light conversion efficiency of β-SiAlON phosphor and KSF phosphor is lower than YAG phosphor, etc., it is necessary to add a larger amount of β-SiAlON phosphor and KSF phosphor to the sealing resin than when using YAG phosphor, etc., which results in a problem that the sealing resin has a higher phosphor concentration and viscosity of the sealing resin is thereby increased. Such an increase in viscosity of the sealing resin causes stringiness, difficult uniform dispersion of phosphor, unstable liquid level and difficult defoaming during a process of sealing the light-emitting element, leading to a decrease in productivity and an increase in the manufacturing cost.

Against this background, a white light-emitting device is known which offers high color purity and high responsivity by using e.g., a sealing resin containing 13.7 wt % of CASN phosphor ($CaAlSiN_3$:Eu) and 75.7 wt % of green phosphor with respect to 100 wt % of KSF phosphor (see e.g., WO 2015/068513).

Also, a white light-emitting device is known in which a $Mn^{4+}$-activated fluoride complex phosphor and a $Eu^{2+}$-activated alkaline earth silicon nitride phosphor are contained in a sealing resin such that the amount of the $Eu^{2+}$-activated alkaline earth silicon nitride phosphor is not less than 0.5 wt % and not more than 14.0 wt % of the combined amount of all phosphors, and which offers appropriate viscosity of the sealing resin by reducing the amount of the $Eu^{2+}$-activated alkaline earth silicon nitride phosphor as the KSF phosphor (see e.g., WO 2012/050199).

SUMMARY OF THE INVENTION

The white light-emitting device disclosed by WO 2015/068513 may cause a change in a spectrum of emitted white light since the mixture ratio of the CASN phosphor to the KSF phosphor is, e.g., 13.7:100 on wt % basis. Also, the white light-emitting device disclosed by WO 2012/050199 may cause a change in a spectrum of emitted white light since the amount of the $Eu^{2+}$-activated alkaline earth silicon nitride phosphor contained in the resin composition is not less than 0.5 wt % and not more than 14.0 wt % of the combined amount of the $Eu^{2+}$-activated alkaline earth silicon nitride phosphor and the $Mn^{4+}$-activated fluoride complex phosphor. The change in spectrum of emitted white light may cause a change in tone of the white light, which may result in failure to meet the needs of customers.

It is an object of the invention to provide a white light-emitting device that prevents a change in spectrum of the emitted white light and that offers a high luminous flux while securing the high purity of white light, the high responsivity and the appropriate viscosity of the sealing resin.

An embodiment of the invention provides a white light-emitting device defined by [1] to [8] below.

[1] A white light-emitting device, comprising:
a light-emitting element that emits a blue light; and
a sealing resin that seals the light-emitting element and that comprises a first phosphor and a second phosphor, the first phosphor wavelength-converting a portion of the blue light and emitting a red light, the second phosphor wavelength-converting a portion of the blue light and emitting a green light,
wherein the white light-emitting device emits a white light by mixing the blue, red and green lights,
wherein the sealing resin further comprises a third phosphor that wavelength-converts a portion of the blue light, emits a light in a same color gamut as the first or second phosphor, and has a higher light conversion efficiency than the first or second phosphor, and
wherein the third phosphor is included in the sealing resin at an additive amount less than an amount that causes a change in a spectrum of the white light.

[2] The white light-emitting device according to [1], wherein an amount of the third phosphor included is 0.2 to 0.6 wt % with respect to a total amount of the first and second phosphors.

[3] The white light-emitting device according to [1] or [2], wherein a total amount of the first, second and third phosphors included is 48 to 56 wt % with respect to the sealing resin.

[4] The white light-emitting device according to any one of [1] to [3], wherein the first phosphor comprises $K_2SiF_6$:Mn, and
wherein the second phosphor comprises $(Si,Al)_6(O,N)_8$:Eu.

[5] The white light-emitting device according to any one of [1] to [3], wherein the third phosphor comprises a red phosphor with a peak wavelength between 590 nm to 750 nm.

[6] The white light-emitting device according to any one of [1] to [3], wherein the third phosphor comprises a green phosphor with a peak wavelength between 500 nm to 590 nm.

[7] The white light-emitting device according to any one of [1] to [3] and [5], wherein the red phosphor comprises $CaAlSiN_3$:Eu, $(Sr,Ca)AlSiN_3$:$Eu^{2+}$, or $(Sr,Ca)_2Si_5N_8$:$Eu^{2+}$.

[8] The white light-emitting device according to any one of [1] to [3] and [6], wherein the green phosphor comprises ($Y_3Al_5O_{12}$:Ce) or $Lu_3Al_5O_{12}$:Ce.

In regard to the above white light-emitting device, "an additive amount less than an amount that causes a change in a spectrum of the white light" means an amount that before and after the addition of the third phosphor, substantially causes no change in the spectrum (e.g., a spectrum profile defined by optical peak position, optical intensity etc.) of the red right or green light emitted from the first or second phosphor. Herein, the amount that substantially causes no change includes an amount thereof that causes 2 nm of a maximum shift quantity in wavelength or about 20% of incremented or decremented difference in optical intensity.

EFFECTS OF THE INVENTION

According to an embodiment of the invention, a white light-emitting device can be provided that prevents a change in spectrum of the emitted white light and that offers a high luminous flux while securing the high purity of white light, the high responsivity and the appropriate viscosity of the sealing resin.

BRIEF DESCRIPTION OF THE DRAWINGS

Next, the present invention will be explained in more detail in conjunction with appended drawings, wherein.

DETAILED DESCRIPTION OF THE PREFERRED EMBODIMENTS

Embodiment

Figure 1:
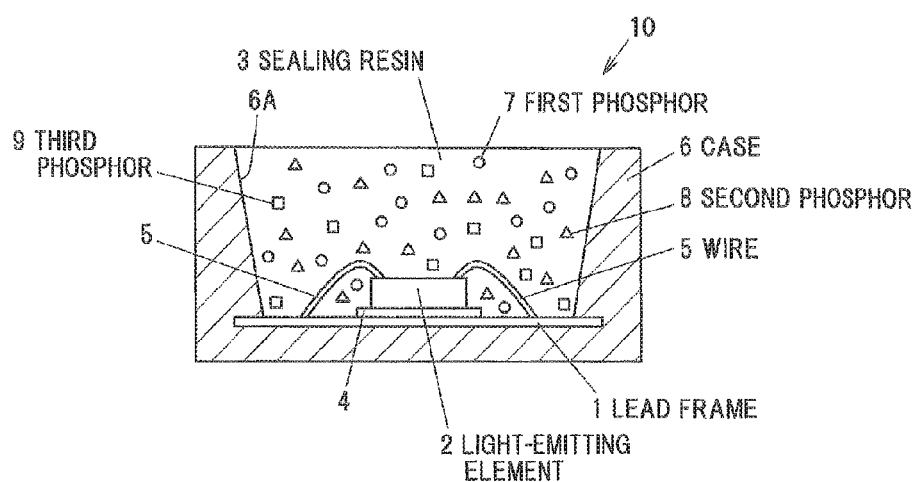
FIG. 1 is a vertical cross-sectional view showing a white light-emitting device in a first embodiment.

FIG. 1 is a vertical cross-sectional view showing a white light-emitting device in a first embodiment. A white light-emitting device 10 has a case 6 having a recessed portion 6A, a lead frame 1 included in the case 6, a light-emitting element 2 mounted on the lead frame 1 inside the recessed portion 6A, a sealing resin 3 filled inside the recessed portion 6A to seal the light-emitting element 2, and first to third phosphors 7 to 9 contained in the sealing resin 3.

The entire lead frame 1 or the surface thereof is formed of a conductive material such as Ag, Cu or Al. Alternatively, for example, a substrate having a conductive pattern on the surface may be used instead of the lead frame 1.

The light-emitting element 2 is provided with, e.g., a chip substrate and a crystal layer including cladding layers and a light-emitting layer sandwiched therebetween, and has n- and p-electrodes (not shown) formed on a surface opposite to the chip substrate. Light emitted from the light-emitting element 2 is blue light in a wavelength range of 430 to 480 nm and has a peak wavelength at around 450 nm.

The light-emitting element 2 is fixed to the lead frame 1 by a die bonding paste 4, and the n- and p-electrodes of the light-emitting element 2 are connected to the lead frame 1 by wire bonding using wires 5. That is, the light-emitting element 2 is electrically connected to the lead frame 1. The light-emitting element 2 may be of a face-up type as shown in the drawing or of a face-down type with the crystal layer facing downward.

The sealing resin 3 is formed of a resin material, e.g., a silicone-based resin or an epoxy-based resin, etc.

The case 6 is formed by injection molding or transfer molding using, e.g., a thermoplastic resin such as polyphthalamide resin, LCP (Liquid Crystal Polymer) or PCT (Polycyclohexylene Dimethylene Terephthalate), or a thermosetting resin such as silicone resin, modified silicone resin, epoxy resin or modified epoxy resin. The case 6 may contain light-reflecting particles of titanium dioxide, etc., to improve light reflectance.

The first phosphor 7, the second phosphor 8 and the third phosphor 9 are dispersed in the sealing resin 3. The first phosphor 7 is excited by a portion of blue light emitted from the light-emitting element 2 and emits red light. The second phosphor 8 is excited by a portion of blue light emitted from the light-emitting element 2 and emits green light. The third phosphor 9 is excited by a portion of blue light emitted from the light-emitting element 2, emits light in the same color gamut as the light emitted from the first phosphor 7 or the second phosphor 8 and has higher light conversion efficiency than the first phosphor 7 or the second phosphor 8. In the drawing, the first phosphor 7 is depicted by "○", the second phosphor 8 by "Δ" and the third phosphor 9 by "□" for descriptive purposes.

The blue light emitted from the light-emitting element 2, the red light emitted from the first phosphor 7, the green light emitted from the second phosphor 8 and the red or green light emitted from the third phosphor 9 are mixed in the sealing resin 3 and white light as a mixed color is emitted from a light-emitting surface.

The first phosphor 7 is, e.g., a KSF phosphor ($K_2SiF_6$:Mn). The KSF phosphor 7 has a narrow emission spectrum with a peak wavelength at around 630 nm, and thus emits high purity red light.

The second phosphor 8 is, e.g., a β-SiAlON phosphor ($(Si,Al)_6(O,N)_8$:Eu). The β-SiAlON phosphor has a narrow emission spectrum with a peak wavelength at around 540 nm, and thus emits high purity green light.

The third phosphor 9 is a red phosphor with a peak wavelength between 590 nm to 750 nm or a green phosphor with a peak wavelength between 500 nm to 590 nm.

The red phosphor used as the third phosphor 9 is preferably a CASN phosphor, a SCASN phosphor (($Sr,Ca$)$AlSiN_3$:$Eu^{2+}$), or ($Sr,Ca$)$_2Si_5N_8$:$Eu^{2+}$.

The green phosphor used as the third phosphor 9 is preferably a YAG phosphor ($Y_3Al_5O_{12}$:Ce), or a LuAG phosphor ($Lu_3Al_5O_{12}$:Ce).

The combined content of the first phosphor 7, the second phosphor 8 and the third phosphor 9 contained in the sealing resin 3 is 48 to 56 wt % of the sealing resin 3. The reason is as follows: when the combined amount of the first to third phosphors 7 to 9 is less than 48 wt %, the absolute amount of the phosphors in the sealing resin 3 is small and chromaticity of white light thus changes. On the other hand, when the combined amount of the first to third phosphors 7 to 9 is more than 56 wt %, the concentration of phosphors in the sealing resin 3 is increased and viscosity of the sealing resin 3 is thus increased.

The amount of the third phosphor 9 contained in the sealing resin 3 is less than the amount causing a change in the emission spectrum of white light. The amount of the third phosphor 9 is 0.2 to 0.6 wt % of the combined amount of the first phosphor 7, the second phosphor 8 and the third phosphor 9. By configuring such that the sealing resin 3 containing the first and second phosphors 7 and 8 further contains the third phosphor 9 so that the amount of the third phosphor 9 is less than the amount causing a change in the emission spectrum of white light, brightness of red or green light emitted from the first phosphor 7 or the second phosphor 8 is intensified and the amount of the first phosphor 7 or the second phosphor 8 contained in the sealing resin 3 thus can be reduced without a decrease in light emission efficiency as compared to when using only the first and second phosphors 7 and 8.

The reason why the amount of the third phosphor 9 is 0.2 to 0.6 wt % of the combined amount of the first, second and third phosphors 7, 8 and 9 is as follows: when the amount of the third phosphor 9 is less than 0.2 wt %, the third phosphor 9 does not provide light emission required to intensify the brightness of the red or green light emitted from the first phosphor 7 or the second phosphor 8 and it is not possible to reduce the amount of the first phosphor 7 or the second phosphor 8 in the sealing resin 3. On the other hand, when the amount of the third phosphor 9 is more than 0.6 wt %, the spectrum of white light changes and this causes a variation in chromaticity of white light.

Also, the third phosphor 9 has higher light conversion efficiency than the first and second phosphors 7 and 8 and hence more blue light from the light-emitting element 2 is absorbed. Therefore, a luminous flux of the white light-emitting device 10 can be improved by reducing loss due to reflection.

EXAMPLES

Next, Examples of the invention will be described.

The light-emitting element 2 with an emission peak wavelength of 450 nm was mounted on the lead frame 1 provided inside the recessed portion 6A of the case 6 and was then sealed with the sealing resin 3 formed of a silicone-based resin containing a KSF phosphor as the first phosphor 7, a β-SiAlON phosphor as the second phosphor 8 and a SCASN phosphor as the third phosphor 9, thereby obtaining the white light-emitting device 10.

The SCASN phosphor was altered to have a different peak wavelength of 625 nm, 620 nm or 610 nm by changing the ratio of Sr and Ca in $(Sr,Ca)AlSiN_3:Eu^{2+}$. The device containing the SCASN phosphor with a peak wavelength of 625 nm was obtained as Example 1, the device containing the SCASN phosphor with a peak wavelength of 620 nm was obtained as Example 2, and the device containing the SCASN phosphor with a peak wavelength of 610 nm was obtained as Example 3.

Using the sealing resin 3 containing a KSF phosphor as the first phosphor 7, a β-SiAlON phosphor as the second phosphor 8 and YAG as the third phosphor 9, the white light-emitting device 10 as Example 4 was also made in the same manner as Examples 1 to 3.

Meanwhile, using the sealing resin 3 containing a KSF phosphor as the first phosphor 7 and a β-SiAlON phosphor as the second phosphor 8 but not containing the third phosphor, the white light-emitting device 10 as Comparative Example was made in the same manner as Examples 1 to 3.

Table 1 shows the combination of phosphors, the total concentration of phosphors, the percentage of the first phosphor, the percentage of the second phosphor and the percentage of the third phosphor in Examples 1 to 4 and Comparative Example.

TABLE 1

| Combination of phosphors | | Total concentration of phosphors | Percentage of first phosphor | Percentage of second phosphor | Percentage of third phosphor |
|---|---|---|---|---|---|
| Example 1 | β-SiAlON + KSF + SCASN625 nm | 52.5 wt % | 81.6 wt % | 18 wt % | 0.4 wt % |
| Example 2 | β-SiAlON + KSF + SCASN620 nm | 52.5 wt % | 82.6 wt % | 17 wt % | 0.4 wt % |
| Example 3 | β-SiAlON + KSF + SCASN610 nm | 52.5 wt % | 82.6 wt % | 17 wt % | 0.4 wt % |
| Example 4 | β-SiAlON + KSF + YAG | 54.5 wt % | 84.6 wt % | 15 wt % | 0.4 wt % |
| Comparative Example | β-SiAlON + KSF | 57.0 wt % | 84 wt % | 16 wt % | — |

As obvious from Table 1, in Comparative Example using the KSF phosphor as the first phosphor 7 and the β-SiAlON phosphor as the second phosphor 8 but not using the third phosphor, the percentage of the first phosphor 7 needed to be increased to 84 wt % in order to obtain the white light-emitting device 10 having predetermined characteristics, which results in that the total concentration of phosphors in the sealing resin 3 was increased to 57.0 wt %.

In contrast, in all of Examples 1 to 3 in which the amount of the SCASN phosphor as the third phosphor 9 was 0.4 wt % of the combined amount of the first, second and third phosphors 7, 8 and 9, it was possible to reduce the percentage of the first phosphor 7, which results in that the total concentration of phosphors in the sealing resin 3 was reduced to 52.5 wt %.

Meanwhile, in Example 4 in which the amount of the YAG phosphor as the third phosphor 9 was 0.4 wt % of the combined amount of the first, second and third phosphors 7, 8 and 9, it was possible to reduce the percentage of the second phosphor, which results in that the total concentration of phosphors in the sealing resin 3 was reduced to 54.5 wt %.

Based on the above result, by configuring such that the sealing resin 3 containing the first and second phosphors 7 and 8 further contains the third phosphor 9 having higher light conversion efficiency than the first and second phosphors 7 and 8 and emitting light in the same color gamut as the light emitted from the first phosphor 7 or the second phosphor 8 so that the amount of the third phosphor 9 is less than the amount causing a change in the emission spectrum of white light, the amount of the first phosphor 7 or the second phosphor 8 contained in the sealing resin 3 can be reduced without a decrease in light emission efficiency as compared to when using only the first and second phosphors 7 and 8. Therefore, it is possible to suppress an increase in viscosity of the sealing resin 3.

Figure 2A:
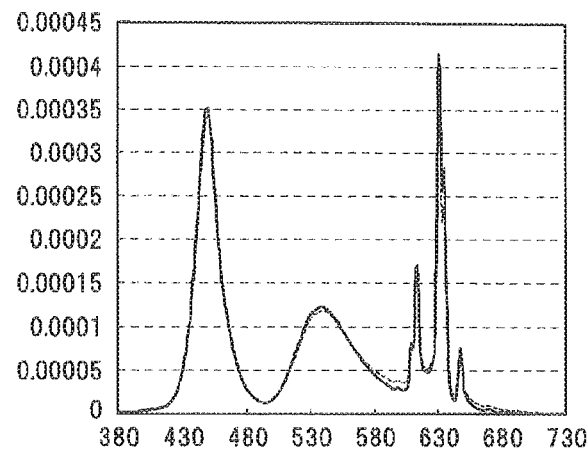
FIGS. 2A, 2B and 2C are graphs showing emission spectra of white light in Example 1 and Comparative Example.

FIG. 2A shows emission spectra of white light in Example 1 and Comparative Example. In the drawing, Example 1 is indicated by the solid line and Comparative Example is indicated by the dotted line. In comparison of two emission spectra, it is understood that the peak position of the spectrum, the full width at half maximum and the emission spectrum intensity are substantially the same. This is because the amount of the SCASN phosphor as the third phosphor 9 contained in the sealing resin 3 was as very small as 0.4 wt % of the combined amount of the first, second and third phosphors 7, 8 and 9 and a spectral peak of the red or green light emitted from the third phosphor 9 thus did not appear.

Figure 2B:
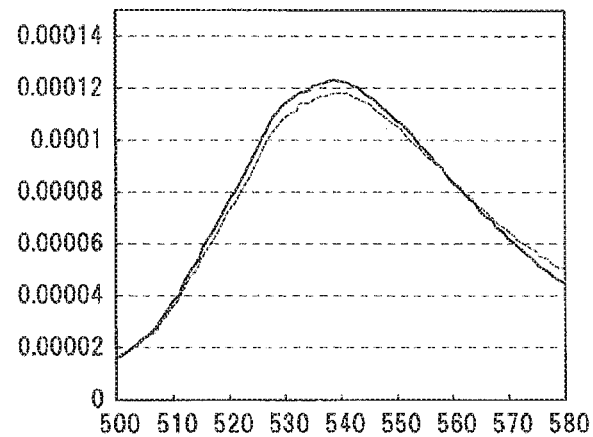
Figure 2C:
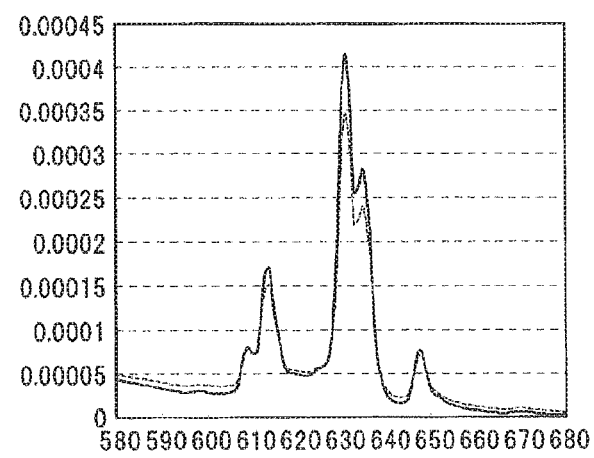

FIG. 2B shows spectra of FIG. 2A in the wavelength range corresponding to green light, and FIG. 2C shows spectra of FIG. 2A in the wavelength range corresponding to red light. In comparison of two emission spectra, there is a slight difference in emission spectrum intensity around the spectral peak of 540 nm in FIG. 2A and around the spectral peak of 630 nm in FIG. 2C, but the difference is within 20% and emission spectra are about the same.

When a red phosphor is selected as the third phosphor 9 as is in Examples 1 to 3, there is substantially no difference in emission spectral position as shown in FIGS. 2A to 2C. Meanwhile, when a green phosphor is selected as the third phosphor 9, there is a difference of ±2 nm but the difference is very small even in this case and does not cause a change in emission spectrum of white light.

Figure 3:
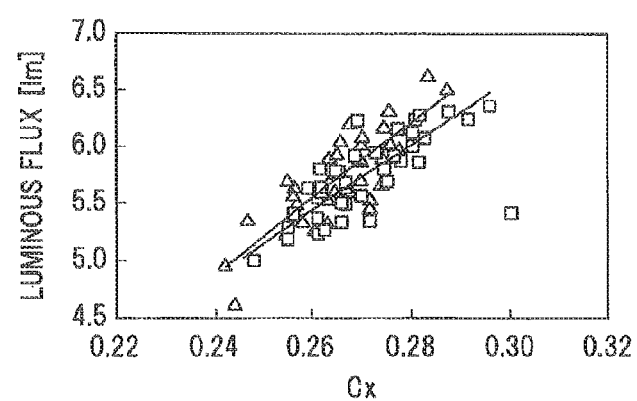
FIG. 3 is a graph showing the approximate lines for luminous fluxes of white light-emitting devices in Example 1 and Comparative Example.

FIG. 3 is a graph in which the luminous fluxes of the white light-emitting devices in Example 1 and Comparative Example measured while changing chromaticity are shown as the approximate lines. As understood from the drawing, Example 1, in which the amount of the SCASN phosphor as the third phosphor 9 was 0.4 wt % of the combined amount of the first, second and third phosphors 7, 8 and 9, has a better luminous flux than Comparative Example in which the third phosphor 9 is not contained.

Effects of the Embodiment

In the present embodiment, by configuring such that the sealing resin 3 containing the first and second phosphors 7 and 8 further contains the third phosphor 9 having higher light conversion efficiency than the first and second phosphors 7 and 8 and emitting light in the same color gamut as the light emitted from the first phosphor 7 or the second phosphor 8 so that the amount of the third phosphor 9 is less than the amount causing a change in the emission spectrum of white light, it is possible to prevent a change in emission spectrum and also possible to improve the luminous flux while maintaining the appropriate viscosity of the sealing resin.

The invention is not intended to be limited to the embodiment and the various kinds of modifications can be implemented without departing from the gist of the invention.

In addition, the invention according to claims is not to be limited to the embodiment. Further, please note that all combinations of the features described in the embodiment are not necessary to solve the problem of the invention.

What is claimed is:

1. A white light-emitting device, comprising:
a light-emitting element that emits a blue light; and
a sealing resin that seals the light-emitting element and that comprises a first phosphor and a second phosphor, the first phosphor wavelength-converting a portion of the blue light and emitting a red light, the second phosphor wavelength-converting a portion of the blue light and emitting a green light,
wherein the white light-emitting device emits a white light by mixing the blue, red and green lights,
wherein the sealing resin further comprises a third phosphor that wavelength-converts a portion of the blue light, emits a light in a same color gamut as the first or second phosphor, and has a higher light conversion efficiency than the first or second phosphor, and
wherein an amount of the third phosphor in the sealing resin is 0.2 wt % to 0.6 wt % with respect to a total amount of the first and second phosphors, so as not to cause a change in a spectrum of the white light.

2. The white light-emitting device according to claim 1, wherein a total amount of the first, second and third phosphors included is 48 to 56 wt % with respect to the sealing resin.

3. The white light-emitting device according to claim 1, wherein the first phosphor comprises $K_2SiF_6$:Mn, and
wherein the second phosphor comprises $(Si,Al)_6(O,N)_8$:Eu.

4. The white light-emitting device according to claim 1, wherein the third phosphor comprises a red phosphor with a peak wavelength between 590 nm to 750 nm.

5. The white light-emitting device according to claim 1, wherein the third phosphor comprises a green phosphor with a peak wavelength between 500 nm to 590 nm.

6. The white light-emitting device according to claim 1, wherein the third phosphor comprises a red phosphor including $CaAlSiN_3$:Eu, $(Sr,Ca)AlSiN_3$:$Eu^{2+}$, or $(Sr,Ca)_2Si_5N_8$:$Eu^{2+}$.

7. The white light-emitting device according to claim 1, wherein the third phosphor comprises a green phosphor including $(Y_3Al_5O_{12}$:Ce) or $Lu_3Al_5O_{12}$:Ce.

8. The white light-emitting device according to claim 1, further comprising:
a case including a recessed portion, the light-emitting element and the sealing resin being formed in the recessed portion.

9. The white light-emitting device according to claim 1, further comprising:
a lead frame formed in the case, the light-emitting element being mounted on the lead frame.

10. The white light-emitting device according to claim 9, wherein the sealing resin contacts that lead frame and the first, second and third phosphors are dispersed in the sealing resin from the lead frame to a light-emitting surface of the sealing resin.

11. The white light-emitting device according to claim 9, further comprising:
a bonding wire formed in the sealing resin and connecting the lead frame to the light-emitting element.

12. The white light-emitting device according to claim 11, wherein the light-emitting element comprises a face-up type light-emitting element, and the bonding wire is bonded to an upper surface of the light-emitting element.

13. The white light-emitting device according to claim 1, wherein the third phosphor comprises a red phosphor including one of $(Sr,Ca)AlSiN_3$:$Eu^{2+}$ and $(Sr,Ca)_2Si_5N_8$:$Eu^{2+}$.

14. A white light-emitting device, comprising:
a case including a recessed portion;
a light-emitting element formed in the recessed portion and emitting a blue light; and
a sealing resin formed on the light-emitting element in the recessed portion and sealing the light-emitting element, the sealing resin comprising:
a first phosphor that wavelength-converts a portion of the blue light and emits a red light;
a second phosphor that wavelength-converts a portion of the blue light and emits a green light, the green light mixing with the blue light and the red light to emit a white light; and
a third phosphor that wavelength-converts a portion of the blue light, emits a light in a same color gamut as the first or second phosphor, and has a higher light conversion efficiency than the first or second phosphor, an amount of the third phosphor in the sealing resin being in a range from 0.2 wt % to 0.6 wt % with respect to a total amount of the first and second phosphors, so as not to cause a change in a spectrum of the white light,
wherein the third phosphor comprises one of:
a red phosphor including one of $CaAlSiN_3$:Eu, $(Sr,Ca)AlSiN_3$:$Eu^{2+}$ and $(Sr,Ca)_2Si_5N_8$:$Eu^{2+}$; and
a green phosphor including one of $(Y_3Al_5O_{32}$:Ce) and $Lu_3Al_5O_{12}$:Ce.

15. The white light-emitting device according to claim 14, wherein the third phosphor comprises the red phosphor including one of $CaAlSiN_3$:Eu, $(Sr,Ca)AlSiN_3$:$Eu^{2+}$ and $(Sr,Ca)_2Si_5N_8$:$Eu^{2+}$.

16. The white light-emitting device according to claim 14, wherein the third phosphor comprises the green phosphor including one of $(Y_3Al_5O_{12}$:Ce) and $Lu_3Al_5O_{12}$:Ce.

* * * * *